United States Patent
Takagiwa

(10) Patent No.: US 9,246,474 B2
(45) Date of Patent: Jan. 26, 2016

(54) DRIVE CIRCUIT FOR INSULATED GATE SWITCHING ELEMENT

(71) Applicant: FUJI ELECTRIC CO., LTD., Kawasaki-shi (JP)

(72) Inventor: Kazumi Takagiwa, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 13/738,100

(22) Filed: Jan. 10, 2013

(65) Prior Publication Data
US 2013/0147525 A1    Jun. 13, 2013

Related U.S. Application Data

(63) Continuation of application No. PCT/JP2012/002425, filed on Apr. 6, 2012.

(30) Foreign Application Priority Data

May 11, 2011 (JP) ................. 2011-106182

(51) Int. Cl.
H03B 1/00 (2006.01)
H03K 3/00 (2006.01)
(Continued)

(52) U.S. Cl.
CPC .............. H03K 3/012 (2013.01); H03K 17/163 (2013.01)

(58) Field of Classification Search
CPC ................. H03K 19/018528; H03K 17/0822; H03K 19/00361; H03K 19/01721; H03K 2217/0036; H03K 2217/0081; G09G 3/3283; H02M 1/08; H02M 1/32
USPC ................. 327/108–112, 427, 430, 432, 434; 326/82, 83
See application file for complete search history.

(56) References Cited

U.S. PATENT DOCUMENTS 5,796,278 A * 8/1998 Osborn et al. ................. 327/108
5,864,253 A * 1/1999 Katakura et al. .............. 327/297
(Continued)

FOREIGN PATENT DOCUMENTS

JP    11-346147 A    12/1999
JP    2000-040849 A    2/2000
(Continued)

OTHER PUBLICATIONS

Partial translation of Notification of Reason for Refusal issued in corresponding Japanese Patent Application No. 2013-513908 dated Jun. 11, 2013.
(Continued)

Primary Examiner — Lincoln Donovan
Assistant Examiner — Thomas Skibinski
(74) Attorney, Agent, or Firm — Rossi, Kimms & McDowell LLP

(57) ABSTRACT

Embodiments of the invention provide a drive circuit including: a constant current source that generates a constant current; a switching circuit that connects a gate of the insulated gate switching element to a power supply potential side via the constant current source when turning the insulated gate switching element ON and connects the gate of the insulated gate switching element to a reference potential side via a discharge circuit when turning the insulated gate switching element OFF; a gate voltage detection circuit that detects a gate voltage of the insulated gate switching element; and a current mode selection circuit that switches a mode of the constant current source from a normal current mode to a low current consumption mode when detecting, based on the gate voltage detected by the gate voltage detection circuit, that the insulated gate switching element is turned ON.

7 Claims, 4 Drawing Sheets

(51) Int. Cl.
*H03K 3/012* (2006.01)
*H03K 17/16* (2006.01)

(56) References Cited

U.S. PATENT DOCUMENTS

| | | | |
|---|---|---|---|
| 6,222,403 B1 | 4/2001 | Mitsuda | |
| 6,335,657 B1* | 1/2002 | Hayase et al. | 327/560 |
| 6,545,513 B2* | 4/2003 | Tsuchida et al. | 327/108 |
| 7,256,371 B2* | 8/2007 | Crawford et al. | 219/494 |
| 7,274,224 B2* | 9/2007 | Nagayoshi | 327/108 |
| 2002/0105373 A1* | 8/2002 | Sudo | 327/538 |
| 2005/0205549 A1 | 9/2005 | Crawford et al. | |
| 2008/0048737 A1* | 2/2008 | Ito et al. | 327/109 |
| 2008/0094111 A1* | 4/2008 | Nakamori et al. | 327/108 |
| 2009/0002054 A1 | 1/2009 | Tsunoda et al. | |
| 2010/0013542 A1 | 1/2010 | Kuroda | |
| 2010/0102731 A1* | 4/2010 | Lin et al. | 315/160 |
| 2010/0176783 A1* | 7/2010 | Tagome | 323/284 |
| 2010/0213989 A1* | 8/2010 | Nakatake et al. | 327/109 |
| 2012/0126859 A1* | 5/2012 | Kawamoto et al. | 327/108 |
| 2012/0299624 A1* | 11/2012 | Sugahara | 327/109 |

FOREIGN PATENT DOCUMENTS

| | | |
|---|---|---|
| JP | 2002-197852 A | 12/2002 |
| JP | 2005-260752 A | 9/2005 |
| JP | 2007-116760 A | 5/2007 |
| JP | 2008-054375 A | 3/2008 |
| JP | 2008-103895 A | 5/2008 |
| JP | 2009-011049 A | 1/2009 |
| JP | 2009-055652 A | 12/2009 |
| JP | 2010-45759 A | 2/2010 |
| JP | 2010-184449 A | 8/2010 |
| WO | 2008/155917 A1 | 12/2008 |

OTHER PUBLICATIONS

ISR issued for PCT/JP2012/002425.

Japanese Office Action cited in Japanese counterpart application No. JP2013-513908, dated Oct. 29, 2013. English translation provided.

Office Action issued in CN201280001978.9, mailed Oct. 9, 2015. English translation provided.

* cited by examiner

DRIVE CIRCUIT FOR INSULATED GATE SWITCHING ELEMENT

CROSS-REFERENCE TO RELATED APPLICATIONS

This application is a continuation of International Application No. PCT/JP2012/002425, filed on Apr. 6, 2012, which is based on and claims priority to Japanese Patent Application No. JP 2011-106182, filed on May 11, 2011. The disclosure of the Japanese priority application and the PCT application in their entirety, including the drawings, claims, and the specification thereof, are incorporated herein by reference.

BACKGROUND

1. Field of the Invention

Embodiments of the invention relate to drive circuits for driving insulated gate switching elements such as an IGBT (Insulated Gate Bipolar Transistor) or MOSFET (Metal Oxide Semiconductor Field Effect Transistor).

2. Related Art

A semiconductor device that has packaged therein an insulated gate switching element, such as an IGBT, and a drive circuit for driving the switching element is called "IPM (Intelligent Power Module)". A power switching element such as an IGBT is mounted on the IPM for driving a motor or the like. Application of excess current to this power switching element can immensely damage an electronic device equipped with the IPM. For this reason, the semiconductor device is provided with a self protection function that constantly monitors the current flowing to the power switching element and safely stops the control by discontinuing the supply of gate signals when an excess current beyond a predetermined current value flows to the power switching element.

Such a conventional IPM adopts an IGBT drive system that connects a P-channel MOSFET 51 and an N-channel MOSFET 52 in series, as shown in FIG. 4. The source of the P-channel MOSFET 51 is connected to a power supply voltage Vcc, while the source of the N-channel MOSFET 52 is connected to a ground potential. The drains of the P-channel MOSFTET 51 and the N-channel MOSFET 52 are connected to the gate of an IGBT 53, and a drive signal is input to the gate of the P-channel MOSFET 51 and the gate of the N-channel MOSFET 52.

When turning the IGBT 53 ON, the level of the drive signal is lowered so that the P-channel MOSFET 51 is turned ON and the N-channel MOSFET 52 is turned OFF. Consequently, the power supply voltage Vcc is applied to the gate of the IGBT 53 via the P-channel MOSFET 51.

When turning the IGBT 53 OFF, on the other hand, the level of the drive signal is increased so that the P-channel MOSFET 51 is turned OFF and the N-channel MOSFET 52 is turned ON. Consequently, the ground potential is applied to the gate of the IGBT 53 via the N-channel MOSFET 52.

In this configuration, ON-resistances of the P-channel MOSFET 51 and the N-channel MOSFET 52 are used for driving the IGBT 53 so as to turn the IGBT 53 ON and OFF.

In this system where the IGBT 53 is driven by the ON-resistances of the P-channel MOSFET 51 and the N-channel MOSFET 52, the ON-resistances of the P-channel MOSFET 51 and the N-channel MOSFET 52 increase at a temperature higher than a room temperature. Therefore, when the temperature is higher than the room temperature, the charge rate at the gate of the IGBT 53 slows down and a steep voltage change (voltage between the collector and the emitter of an IGBT 43) is prevented, alleviating the occurrence of noise related to the voltage change. Nevertheless, the problem is the increase in losses due to an increase in time required to turn the IGBT 53 ON. However, when the design of the semiconductor device is optimized in order to minimize the losses in high temperatures, the charge rate at the gate of the IGBT 53 becomes extremely low at the room temperature, causing a steep voltage change and consequently increasing noise.

In order to solve these problems, Patent Document 1 proposes a drive circuit for an insulated gate device.

In Japanese Patent Application Publication No. 2008-103895 (also referred to herein as "Patent Document 1"), the drive circuit for an IGBT is provided with a constant current source generating a constant current and configured by a current mirror circuit, a switching circuit that connects a gate of the IGBT to a power supply potential side via the constant current source when turning the IGBT ON and disconnects the gate of the IGBT from the power supply potential side via the constant current source when turning the IGBT OFF, and a discharge circuit that turns the IGBT OFF. When the level of a drive signal becomes low, the switching circuit connects the gate of the IGBT to the power supply potential side via the constant current source, to turn the IGBT ON. When, on the other hand, the level of the drive signal becomes high, the switching circuit terminates the connection made between the gate of the IGBT and the power supply potential side via the constant current source, and the discharge circuit connects the gate of the IGBT to a ground potential to turn the IGBT OFF.

Japanese Patent Application Publication No. 2009-11049 (also referred to herein as "Patent Document 2") proposes a gate drive circuit that has a constant-current-pulse gate drive circuit that creates a gate signal for a voltage drive switching device such as an IGBT or FET as a constant-current output, a constant-voltage-pulse gate drive circuit that creates the gate signal as a constant voltage output, and a gate drive circuit that has a decision/switch circuit that switches between an operation of the constant-current-pulse gate drive circuit and an operation of the constant-voltage-pulse gate drive circuit.

Japanese Patent Application Publication No. 2005-260752 (also referred to herein as "Patent Document 3") proposes a technology in which a current on the input side of a constant current source configured by a current mirror circuit is adjusted by bypassing one of the serially-connected resistors by means of a switch element, to change an output current of the constant current source.

Japanese Patent Application Publication No. 2000-40849 (also referred to herein as "Patent Document 4") proposes a technology in which, as with Patent Document 3, a collector of one of PNP transistors configuring a current mirror circuit is connected to a terminal of a ground potential via a variable resistance resistor circuit, and a resistance of the variable resistance resistor circuit is selected using a resistance selecting part, to change an output current of the constant current circuit.

International Patent Publication No. WO 2008/155917 (also referred to herein as "Patent Document 5") proposes a switching element drive circuit that drives a switching element such as an IGBT or MOSFET for switching large power. This switching element drive circuit uses a drive signal output circuit for driving the switching element, to, first, output an increased voltage V2 to a gate of the switching element when a PWM pulse that is input from a PWM pulse output circuit is at a high level, and to, subsequently, output a predetermined voltage V1 lower than the increased voltage V2 to the gate of the switching element when a gate voltage Vgs at the switching element rises to a predetermined voltage. This configuration can prevent switching losses of the switching element.

The demand for low current consumption in the IPM has been increasing, and the amount of current consumed by the IPM has a high proportion of the amount of current consumed by a drive circuit for driving an IGBT and a control circuit for protecting the IGBT.

In the conventional example described in Patent Document 1 above, the insulated gate device can be turned ON via the constant current source, and the temperature dependence of the charge rate of the gate of the insulated gate device can be reduced. Therefore, when turning the insulated gate device ON, the noise caused in a high temperature period and room temperature period can be minimized. Although being able to minimize the noise and losses, the conventional example described in Patent Document 1 has an unsolved problem of not being able to reduce the amount of current consumed by the drive circuit.

In the conventional example described in Patent Document 2, the insulated gate device can be switched ON in a constant time period by driving the insulated gate device at a constant current until the gate voltage exceeds a predetermined voltage. In addition, by switching the mode thereafter to a constant voltage drive mode, the device can be driven without undermining the credibility of the gate oxide film of the device. However, Patent Document 2 has an unsolved problem of not being able to reduce the amount of current consumed by the drive circuit.

Moreover, the conventional examples of Patent Documents 3 and 4 disclose that the current values of the constant current circuits are changed by changing the resistances, but do not at all describe drive circuits of the insulated gate switching elements.

In addition, according to the conventional example described in Patent Document 5, when turning ON the switching element such as an IGBT or MOSFET for switching large power, an increased voltage, higher than a predetermined voltage applied constantly the gate, is applied only for an initial period until the gate voltage of the switching element reaches the predetermined voltage. As a result, the switching operation can be performed promptly without constantly applying an excess voltage to the gate of the switching element when turning the switching element ON. Therefore, this conventional example can shorten the delay time and reduce the switching losses without adding extra stress to the gate of the switching element. However, these conventional examples have certain shortcomings, such as, for example, not being able to reduce the amount of current consumed in the drive circuit thereof.

SUMMARY OF THE INVENTION

Embodiments of the invention address these and other shortcomings in the art. Embodiments of the invention provide a drive circuit for an insulated gate switching element that is capable of reducing the amount of current consumed by the drive circuit driving the insulated gate switching element.

In some embodiments, a first aspect of a drive circuit for an insulated gate switching element according to the present invention has: a constant current source that generates a constant current; a switching circuit that connects a gate of the insulated gate switching element to a power supply potential side via the constant current source when turning the insulated gate switching element ON and connects the gate of the insulated gate switching element to a reference potential side via a discharge circuit when turning the insulated gate switching element OFF; a gate voltage detection circuit that detects a gate voltage of the insulated gate switching element; and a current mode selection circuit that switches a mode of the constant current source from a normal current mode to a low current consumption mode when detecting, based on the gate voltage detected by the gate voltage detection circuit, that the insulated gate switching element is turned ON.

According to this configuration, when turning the insulated gate switching element ON, the mode of the constant current source is set at the normal current mode and a current is injected to the gate of the insulated gate switching element until the gate voltage reaches a predetermined voltage for turning the insulated gate switching element ON. Then, when turning the insulated gate switching element ON and the gate voltage becomes higher than the predetermined voltage, the mode of the constant current source is switched to the low current consumption mode to minimize the amount of current consumed by the drive circuit.

In some embodiments, the constant current source has: a first transistor, a drain side of which is connected to a resistor; a second transistor that configures a current mirror along with the first transistor and generates a constant current defined by a terminal voltage and reference voltage of the resistor; and a third transistor that is current-mirror connected to the second transistor and has a drain connected to the gate of the insulated gate switching element.

According to this configuration, by generating the constant current at the second transistor, a constant current corresponding to this constant current is output from the third transistor to the gate of the insulated gate switching element.

In some embodiments, the constant current source has: a first transistor, a drain side of which is connected to a resistor; a fourth transistor that is connected between the first transistor and the resistor and generates a constant current defined by a terminal voltage and reference voltage of the resistor; and a third transistor that configures a current mirror along with the first transistor and has a drain connected to the gate of the insulated gate switching element.

This configuration can simplify the configuration of the constant current source.

In some embodiments, the current mode selection circuit sets the reference voltage at a normal voltage when the gate voltage detected by the gate voltage detection circuit is less than a predetermined value, and sets the reference voltage at a low consumption mode voltage lower than the normal voltage when the gate voltage detected by the gate voltage detection circuit is equal to or greater than the predetermined value.

According to this configuration, the current mode selection circuit can set the mode of the constant current source at the normal current mode when the gate voltage detected by the gate voltage detection circuit is less than the predetermined value, and set the mode of the constant current source at the low consumption mode when the gate voltage is equal to or greater than the predetermined value.

In some embodiments, the current mode selection circuit has a partial resistor having a power supply-side resistor and ground-side resistor connected between a positive power supply and a ground, sets a ground-side partial resistance value at a normal value when the gate voltage detected by the gate voltage detection circuit is less than a predetermined value, and sets the ground-side partial resistance value at a low consumption mode resistance value lower than the normal value when the gate voltage detected by the gate voltage detection circuit is equal to or greater than the predetermined value.

According to this configuration, a current mode selection voltage can be formed easily by changing the partial resistance value in accordance with the gate voltage.

In some embodiments, a threshold value, based on which the gate voltage detection circuit outputs signals of different levels depending on the gate voltage of the insulated gate switching element, is set at 7 V to 14.5 V, which is the gate voltage of the insulated gate switching element.

According to this configuration, the insulated gate switching element can reliably be turned ON and the low consumption current mode can be selected by a low voltage source.

In some embodiments, the gate voltage detection circuit reduces a current value of the constant current source to ½₀ to ½ when the gate voltage of the insulated gate switching element exceeds the threshold value.

According to this configuration, the amount of current consumed by the entire drive circuit can significantly be minimized.

Embodiments of the invention can achieve the effect of accelerating the time to turn the insulated gate switching element ON, with the normal current mode of the constant current source, until the gate voltage of the insulated gate switching element reaches the predetermined voltage at which the insulated gate switching element is turned ON, and then minimizing the amount of current consumed by the drive circuit with the low current consumption mode of the constant current source when the gate voltage reaches the predetermined voltage at which the insulated gate switching element is turned ON.

DETAILED DESCRIPTION

Embodiments of the present invention are described hereinafter with reference to the drawings.

Figure 1:
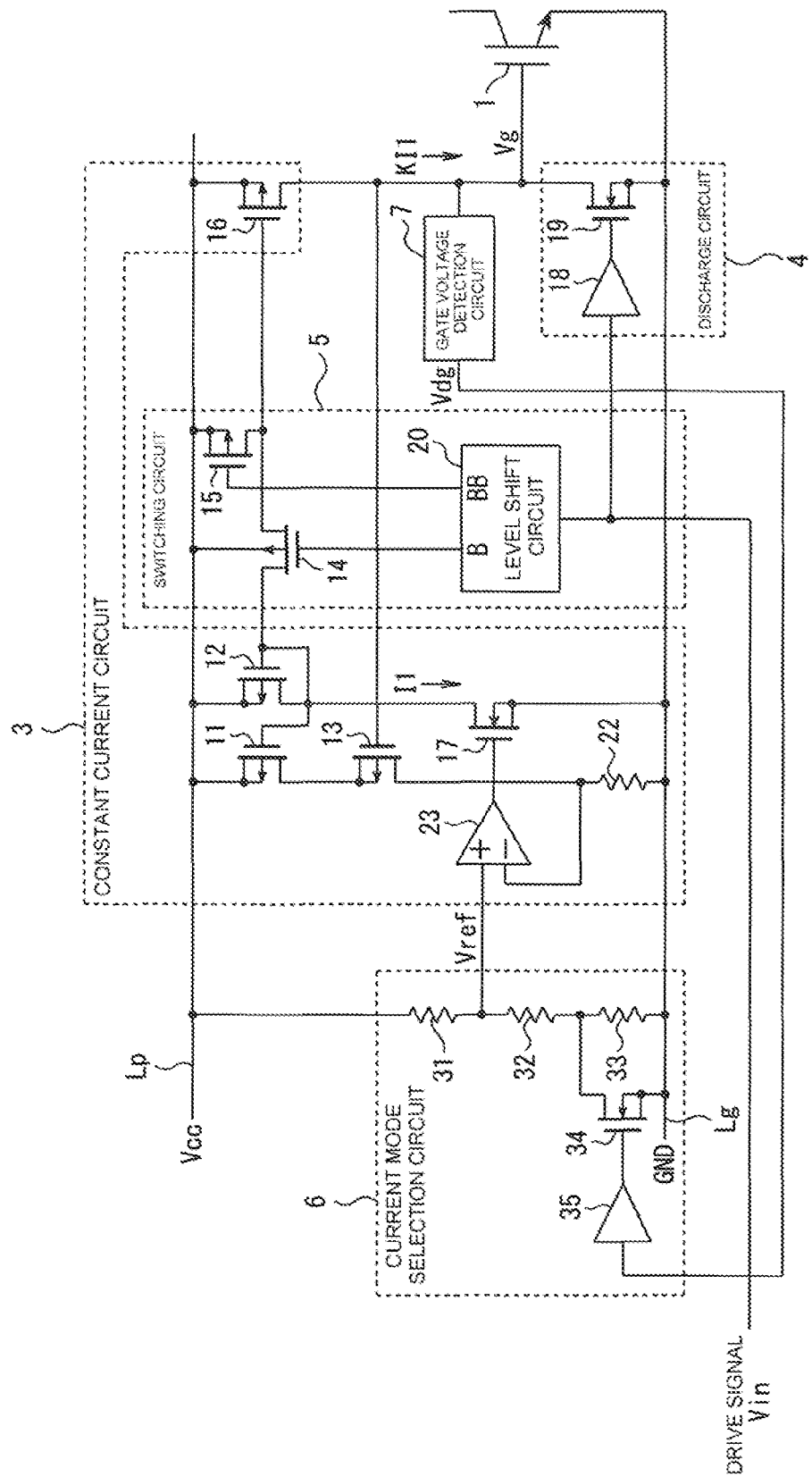
FIG. 1 is a circuit diagram showing a first embodiment of a drive circuit for an insulated gate switching element according to the present invention.

FIG. 1 is a block diagram showing a drive circuit for an insulated gate switching element according to the present invention.

In this diagram, reference numeral 1 represents an insulated gate bipolar transistor (referred to as "IGBT," hereinafter), which is an insulated gate switching element to be driven. This IGBT 1 is incorporated in, for example, an inverter circuit for converting a DC to an AC or a power conversion device such as a DC-DC converter for converting a DC to a DC of different voltage. The insulated gate switching element is not limited to the IGBT; thus, a power MOSFET can be applied as the insulated gate switching element.

A drive circuit 2 for driving the IGBT 1 has a positive-side line Lp connected to a positive power supply Vcc and a ground line Lg connected to a ground. The drive circuit 2 also has a constant current source 3 configuring a charging circuit and generating a constant current, a discharge circuit 4, a switching circuit 5, and a current mode selection circuit 6.

The constant current source 3 has P-channel MOSFETs (Metal Oxide Semiconductor Field Effect Transistor) 11, 12, and 16 functioning as first, second, and third transistors that are current-mirror connected to one another by connecting gates thereof to one another, to configure a current mirror circuit.

The P-channel MOSFET 11 has a source connected to the power supply line Lp and drain connected to the ground line Lg via the P-channel MOSFET 13 and a current detecting resistor 22.

The P-channel MOSFET 12 has a source connected to the power supply line Lp and a drain connected to a drain of an N-channel MOSFET 17 functioning as a fourth transistor. A source of the N-channel MOSFET 17 is connected to the ground Lg.

Furthermore, the P-channel MOSFET 16 has a source connected to the power supply line Lp and a drain connected to a gate of the IGBT 1.

The constant current source 3 has an operational amplifier 23 in which a reference voltage Vref is input from the aftermentioned current mode selection circuit 6 to a non-inverting input side and a terminal voltage of the current detecting resistor 22 is input to an inverting input terminal. An output of the operational amplifier 23 is supplied to a gate of the N-channel MOSFET 17.

The P-channel MOSFETs 11, 12, and 16 have substantially the same channel length. A channel width of the P-channel MOSFET 16 is preferably at least 10 times greater than a channel width of the P-channel MOSFET 12. Also, the resistor 22 and resistors 31 to 33 preferably have temperature characteristics of 100 ppm/° C. or lower.

The discharge circuit 4 has a buffer 18 to which is input a drive signal Vin configured by, for example, a pulse-width modulated (PWM) signal from an external controller, and an N-channel MOSFET 19 having a gate connected to an output side of this buffer 18.

The N-channel MOSFET 19 has a source connected to the ground line Lg and a drain connected to a connection point between a source of the P-channel MOSFET 16 and the gate of the IGBT 1. Thus, a source of the N-channel MOSFET 18 is connected to an emitter of the IGBT 1 via the ground line Lg.

The switching circuit 5 has a level shift circuit 20 and P-channel MOSFETS 14 and 15. The P-channel MOSFET 14 has a source connected to a gate of the P-channel MOSFET 12, a body terminal connected to the power supply line Lp, and a drain connected to a gate of the P-channel MOSFET 16. The P-channel MOSFET 15 has a source connected to the power supply line Lp and a drain connected to a connection between the drain of the P-channel MOSFET 14 and the gate of the P-channel MOSFET 16.

The level shift circuit 20 inputs the abovementioned drive signal Vin to an input terminal A and connects a non-inverting output terminal B and inverting output terminal BB to the gates of the P-channel MOSFET 14 and 15 respectively.

Figure 2:
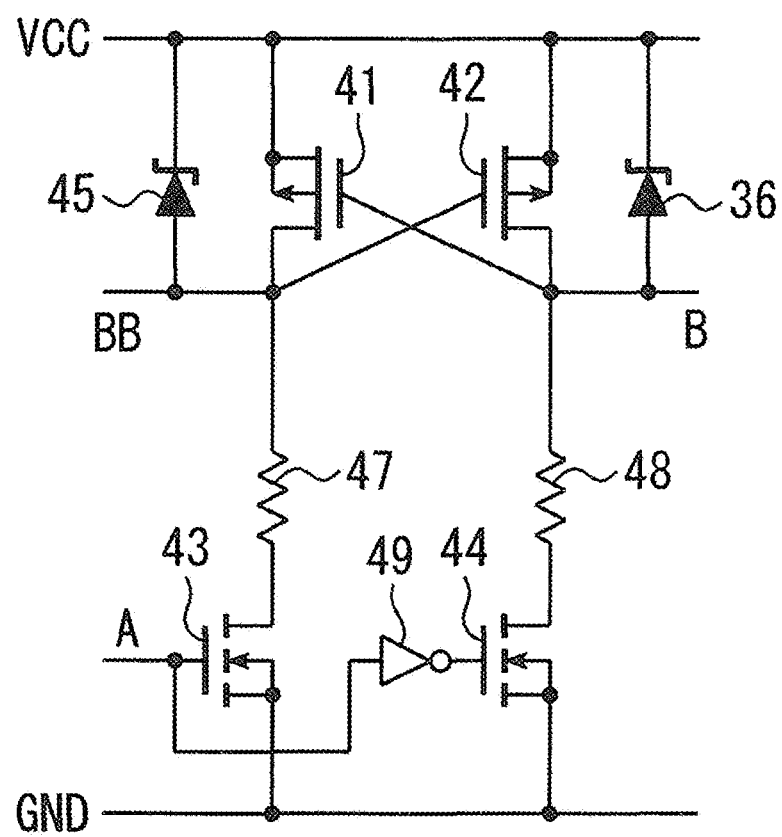
FIG. 2 is a circuit diagram showing a level shift circuit applicable to the present invention.

As shown in FIG. 2, this level shift circuit 20 is configured by connecting a series circuit consisting of a P-channel MOSFET 41, resistor 47, and N-channel MOSFET 43 between the power supply line Lp and the ground line Lg and connecting a series circuit consisting of a P-channel MOSFET 42, resistor 48, and N-channel MOSFET 44 in parallel with the aforementioned series circuit.

A gate of the P-channel MOSFET 41 is connected to a drain of the P-channel MOSFET 42. Similarly, a gate of the P-channel MOSFET 42 is connected to a drain of the P-channel MOSFET 41. Furthermore, zener diodes 45 and 46 are connected in parallel with the P-channel MOSFETS 41 and 42 respectively.

The inverting output terminal BB is derived from a connection point between an anode of the zener diode 45 and the drain of the P-channel MOSFET 41, and a normal rotation output terminal B is derived from a connection point between an anode of the zener diode 46 and the drain of the P-channel MOSFET 42. Moreover, gates of the N-channel MOSFETs 43 and 44 are connected to each other by a logical inversion circuit 49. A connection point between the gate of the N-channel MOSFET 43 and the logical inversion circuit 49 is the input terminal A.

When the level of the drive signal that is input to the input terminal A is high, the level shift circuit 20 turns the N-channel MOSFET 43 ON and the N-channel MOSFET 44 OFF. Consequently, the P-channel MOSFET 42 is turned ON and the P-channel MOSFET 41 is turned OFF. Therefore, a high-level output signal is output from the normal rotation output terminal B, and a low-level output signal is output from the inverting output terminal BB.

On the other hand, when the level of the drive signal Vin is low, the level shift circuit 20 turns the N-channel MOSFET 43 OFF and the N-channel MOSFET 44 ON. Consequently, the P-channel MOSFET 41 is turned ON and the P-channel MOSFET 42 is turned OFF. Therefore, the level of the output signal from the normal rotation output terminal B becomes low, and the level of the output signal that is output to the inverting output terminal BB becomes high.

The current mode selection circuit 6 has the power supply-side resistor 31 that is connected serially to the power supply line Lp and the ground line Lg, and the ground-side resistors 32 and 33. The current mode selection circuit 6 connects the bypass N-channel MOSFET 34 in parallel with the ground-side resistor 33, and connects the output side of the buffer 35 to a gate of this N-channel MOSFET 34.

On the other hand, a gate voltage detection circuit 7 is connected to the connection point between the drain of the P-channel MOSFET 16 and the gate of the IGBT 1. The gate voltage detection circuit 7 is configured to detect that a gate voltage Vg becomes equal to or greater than a predetermined voltage Vs (e.g., 13 V) that is sufficiently higher than a threshold voltage of the IGBT 1. When Vg is less than Vs, the gate voltage detection circuit 7 outputs a gate voltage detection signal Vdg of a low level to the buffer 35 of the current mode selection circuit 6. When Vg is equal to or greater than Vs, the gate voltage detection circuit 7 outputs the gate voltage detection signal Vdg of a high level to the buffer 35 of the current mode selection circuit 6. It is preferred that the predetermined voltage Vs of the gate voltage detection circuit 7 be set at a gate voltage of 7 V to 14.5 V at which the IGBT 1 can surely be turned ON.

In the current mode selection circuit 6, therefore, when the gate voltage Vg of the IGBT 1 detected by the gate voltage detection circuit 7 is less than the predetermined threshold Vs (Vg<Vs), the level of the gate voltage detection signal Vdg becomes low, thereby maintaining the OFF state of the N-channel MOSFET 34. As a result, the ground-side resistor 33 remains connected to the ground-side resistor 32, and a reference voltage Vref1 that is output from the connection point between the power supply-side resistor 31 and the ground-side resistor 32 is expressed by the following formula (1) where R1 represents a resistance value of the power supply-side resistor 31 and R2 and R3 represent resistance values of the ground-side resistors 32 and 33 respectively.

$$V\text{ref}1 = \{(R2+R3)/(R1+R2+R3)\}V\text{cc} \quad (1)$$

At the gate voltage Vg that is equal to or greater than the predetermined voltage Vs enough to turn the IGBT 1 ON, this gate voltage Vg is detected by the gate voltage detection circuit 7. Consequently, the level of the gate voltage detection signal Vdg becomes high, and thereby the N-channel MOSFET 34 is turned ON. As a result, the ground-side resistor R3 is bypassed by the N-channel MOSFET 34, connecting the ground-side resistor 32 to the ground line Lg via the N-channel MOSFET 34. Therefore, a reference voltage Vref2 that is output from the connection point between the power supply-side resistor 31 and the ground-side resistor 32 is expressed by the following formula (2).

$$V\text{ref}2 = \{(R2)/(R1+R2)\}V\text{cc} \quad (2)$$

In this case, when the level of the gate voltage detection signal Vdg of the gate voltage detection circuit 7 is low at the time of: the power supply voltage Vcc=15 V; the resistance value R1 of the resistor 31=50 kΩ; the resistance value R2 of the resistor 32=2 kΩ; the resistance value R3 of the resistor 33=10 kΩ; and the resistance value R4 of the resistor 22=2 kΩ, the reference voltage Vref1 becomes 2.90 V, and a mirror current 11 flowing through the N-channel MOSFET 17 becomes 1.45 mA.

When, on the other hand, the level of the gate voltage detection signal Vdg of the gate voltage detection circuit 7 is high, the reference voltage Vref2 becomes 0.58 V, and the mirror current 11 flowing through the N-channel MOSFET 17 becomes 0.29 mA. In other words, the mirror current becomes approximately ⅕ of the mirror current obtained when the level of gate voltage detection signal Vdg is low.

Next, operations according to the first embodiment are described.

When a high-level signal is input from the external controller to the drive signal Vin as a signal for turning the IGBT OFF, the level of the output signal from the normal rotation output terminal B becomes high and the level of the output signal from the inverting output terminal BB becomes low in the level shift circuit 20. When the pulse-width modulated signal is not input as the drive signal, high-level signals are constantly input to the drive signal Vin in order to keep the IGBT OFF.

As a result, the P-channel MOSFET 14 is turned OFF, the P-channel MOSFET 15 is turned ON, and the P-channel MOSFET 16 is turned OFF. On the other hand, in the discharge circuit, the N-channel MOSFET 19 is turned ON. For this reason, the gate of the IGBT 1 is not injected with current, i.e., not charged, through the constant current source 3. By connecting the gate of the IGBT 1 to the ground line Lg via the N-channel MOSFET 19 of the discharge circuit 4, a discharge state of the IGBT 1 is maintained. Accordingly, the IGBT 1 is turned OFF or kept OFF.

When the level of the drive signal Vin becomes low in the OFF state of the IGBT 1, the level of the output signal from the normal rotation output terminal B of the level shift circuit 20 becomes low, and the level of the output signal from the inverting output terminal BB becomes high. As a result, the P-channel MOSFET 14 is turned ON, and the P-channel MOSFET 15 is turned OFF. This, consequently, configures the current mirror circuit in the constant current source 3, and a mirror current I11 is injected into the gate of the IGBT 1 through the P-channel MOSFET 16, charging the IGBT 1.

At this moment, because the gate voltage Vg of the IGBT 1 is lower than the predetermined voltage Vs, the gate voltage detection signal Vdg that is output from the gate voltage detection circuit 7 keeps its level low. As a result, the N-channel MOSFET 34 of the current mode selection circuit 6 is kept OFF, and the reference voltage Vref1 of a relatively high level (=2.90 V) is supplied to a non-inverting input terminal of the operational amplifier 23. Because the output signal of the operational amplifier 23 produces a relatively high voltage, the N-channel MOSFET 17 is turned ON, and the mirror current I1 of a relatively high level flows thereto. Therefore, the mode of the constant current source 3 becomes the normal current mode where a current kI1 that is k times the mirror current I1 is injected from the P-channel MOSFET 16 to the gate of the IGBT 1. As a result, the IGBT 1 can be turned ON by means of the constant current source 3.

At this moment, the gate voltage Vg increases due to the injection of the current kI1 from the P-channel MOSFET 16 to a gate capacitance of the IGBT 1. When the gate voltage Vg reaches the predetermined voltage Vs that is sufficiently higher than the threshold voltage of the IGBT 1, the gate voltage detection signal Vdg of a high level is output from the gate voltage detection circuit 7. Because this gate voltage detection signal Vdg is supplied to the buffer 35 of the current mode selection circuit 6, the N-channel MOSFET 34 is turned ON. Consequently, the ground-side resistor 33 is bypassed, connecting the ground-side resistor 32 directly to the ground line Lg.

Therefore, the reference voltage decreases from Vref1 (=2.90 V) to Vref2 (=0.58V), and the output voltage of the operational amplifier 23 decreases as well. As a result, the mirror current I1 flowing through the N-channel MOSFET 17 is reduced to approximately ⅕, as described above. For this reason, the mirror current kI1, k times the mirror current I1, which is supplied to the IGBT 1 through the P-channel MOSFET 16, also drops. However, the gate capacitance of the IGBT 1 keeps its charged state and is therefore kept ON.

Because a rise time of the gate voltage is extremely shorter than a switching cycle of the drive signal Vin, a time period in which the gate voltage is less than the predetermined voltage Vs when the IGBT 1 is turned ON is extremely short. Therefore, the average value of the mirror current I1 becomes approximately equivalent to 0.29 mA obtained when the level of the gate voltage detection signal Vdg of the gate voltage detection circuit 7 is high. As a result, the mode of the constant current source can be set at the low power consumption mode.

Incidentally, in the case of the conventional example that is not provided with the gate voltage detection circuit 7 and the current mode selection circuit 6, the mirror current I1 in an amount of 1.45 mA continuously flows during the period in which the IGBT 1 is ON, causing the drive circuit to keep the state of high current consumption.

In the present embodiment, however, the consumption of current can be reduced by 1.45 mA−0.29 mA=1.16 mA during the period in which the IGBT 1 is ON. Because the period in which the IGBT 1 is ON becomes approximately half a calmative time of the drive signal Vin, the amount of current consumed can be reduced by approximately 1.16 mA/2=0.58 mA in the normal switching state.

However, when the level of the drive signal Vin becomes high, the level of the output signal that is output from the normal rotation output terminal B of the level shift circuit 20 becomes high, whereas the level of the output signal that is output from the inverting output terminal BB becomes low. As a result, the P-channel MOSFET 14 is turned OFF, and the P-channel MOSFET 15 is turned ON. Furthermore, the P-channel MOSFET 16 is turned OFF, stopping the injection of the current kI1 into the IGBT 1.

At the same time, because the drive signal Vin of a high level is input to the buffer 18 of the discharge circuit 4, the N-channel MOSFET 19 of this discharge circuit 4 is turned ON. As a result, a gate charge of the IGBT 1 is drawn to the ground line Lg through the P-channel MOSFET 19, whereby the IGBT 1 enters the discharge state, reducing the gate voltage and turning the IGBT 1 OFF.

According to the first embodiment described above, when turning the IGBT 1 ON and when the gate voltage Vg is less than the predetermined voltage Vs sufficiently higher than the threshold voltage for turning the IGBT 1 ON, the reference voltage Vref1 of a high level is supplied to the operational amplifier 23 by means of the current mode selection circuit 6, and the mirror current I1 of the constant current source 3 is set at a normal current value to set the mode of the constant current source 3 at the normal current mode. Subsequently, when the gate voltage Vg reaches the predetermined voltage Vs, the reference voltage Vref2 of a low level is supplied to the operation amplifier 23 by means of the current mode selection circuit 6, and the mirror current I1 of the constant current source 3 is lowered to approximately ⅕ of the normal current value, to set the mode of the constant current source 3 at the low current consumption mode. As a result, the amount of current consumed by the drive circuit can be reduced, while accelerating the time to turn the IGBT 1 ON.

Furthermore, when the gate potential of the IGBT 1 changes from the ground potential to the power supply potential Vcc, the voltage that is substantially the same as a gate potential of the IGBT 21 can be applied to the drain of the P-channel MOSFET 11 by placing the P-channel MOSFET 13 between the P-channel MOSFET 11 and the resistor 22 of the constant current source 3. Consequently, the current balance between the current mirrors of the P-channel MOSFETs 11 and 16 can be maintained. For this reason, the level of current flowing through the P-channel MOSFET 16 can be kept constant, regardless of the gate potential of the IGBT 1 (an OUT terminal voltage of the drive circuit).

Moreover, a stable constant current can be generated by providing the constant current source 3 with the P-channel MOSFET 11 functioning as the first transistor for detecting a constant current and the P-channel MOSFET 12 functioning as the second transistor for controlling the constant current.

In addition, changes can be made easily to the reference voltage Vref based on the gate voltage detection signal Vdg, by configuring the current mode selection circuit 6 with the partial resistors 31 to 33 and the switching element 34.

Figure 3:
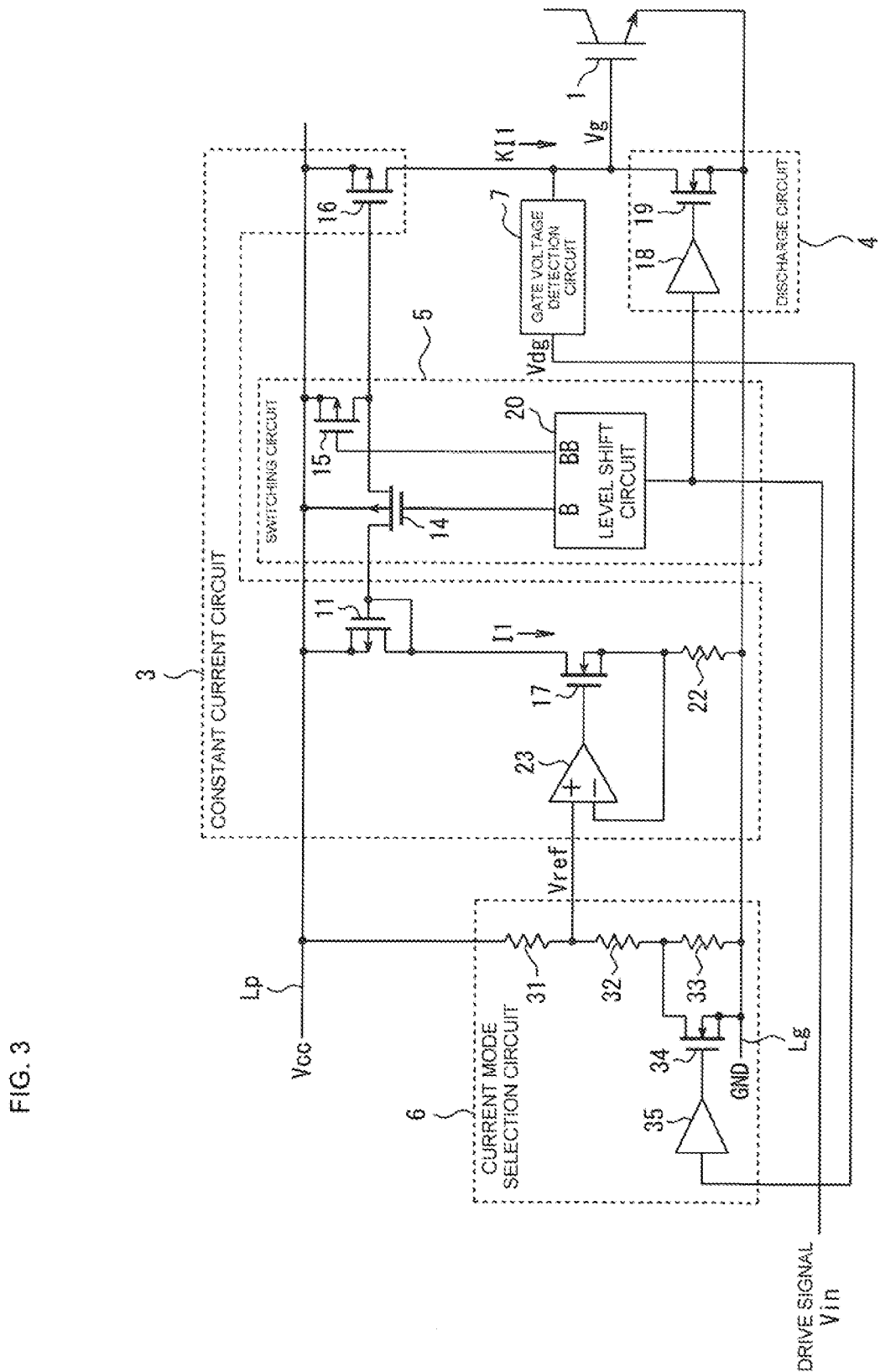
FIG. 3 is a circuit showing a second embodiment of a drive circuit for an insulated gate switching element according to the present invention.
Figure 4:
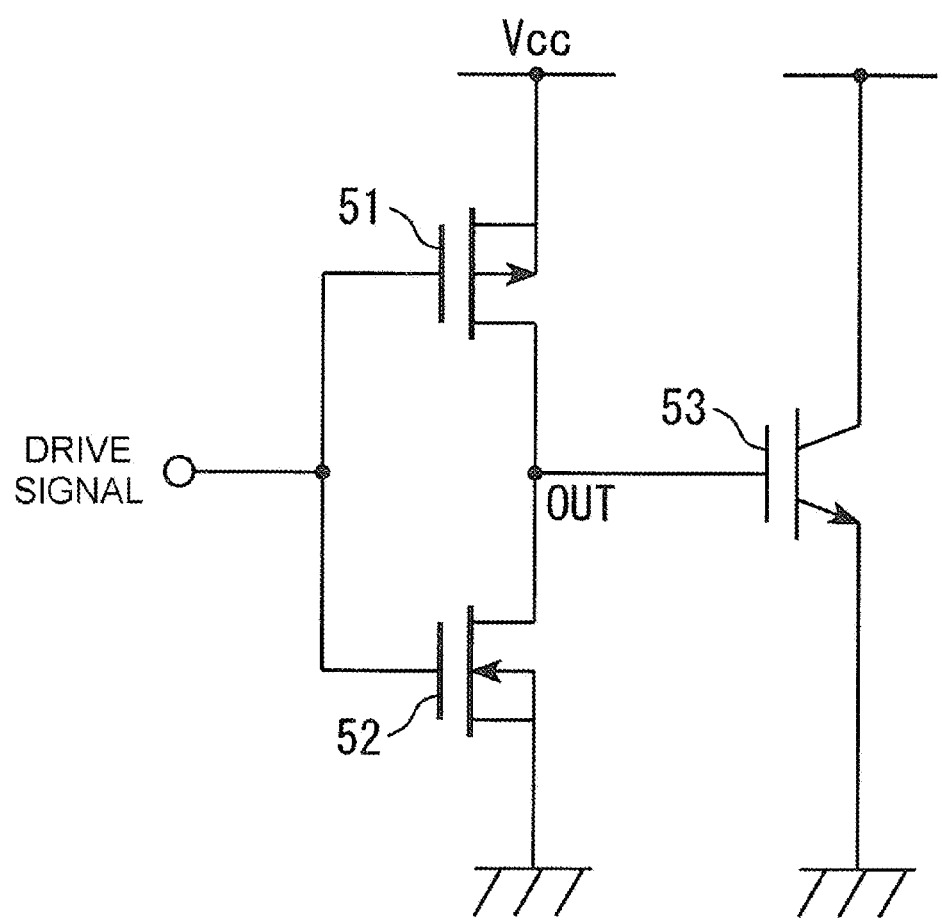
FIG. 4 is a circuit diagram showing a conventional drive circuit for an insulated gate switching element.

Next, a second embodiment of the present invention is described with reference to FIG. 3.

The second embodiment is obtained by simplifying the configuration of the constant current source by omitting the P-channel MOSFETs 12 and 13 functioning as the second and fourth transistors in the first embodiment described above.

In other words, in the second embodiment, the P-channel MOSFETs 12 and 13 functioning as the second and fourth transistors are omitted from the configuration shown in FIG. 1 of the first embodiment. Also, the N-channel MOSFET 17, the gate of which receives input of the output signal from the operational amplifier 23, is connected between the P-channel MOSFET 11 functioning as the first transistor and the resistor 22. The rest of the configuration is the same as the one shown in FIG. 1; thus, the same reference numerals are applied to the sections corresponding to the ones shown in FIG. 1, and the detailed descriptions thereof are omitted accordingly.

In the current mode selection circuit 6, when the level of the gate voltage detection signal Vdg of the gate voltage detection circuit 7 is low under the conditions that the power supply voltage Vcc=15 V, the resistance value R1 of the resistor 31=20 kΩ, the resistance value R2 of the resistor 32=1 kΩ, the resistance value R3 of the resistor 33=5 kΩ, and the resistance value R4 of the resistor 22=3 kΩ, the reference voltage Vref1 becomes 3.46 V based on the formula (1) provided previously, and the mirror current I1 flowing through the N-channel MOSFET 17 becomes 1.15 mA.

When, on the other hand, the level of the gate voltage detection signal Vdg of the gate voltage detection circuit 7 is high, the reference voltage Vref2 becomes 0.71 V based on the formula (2) provided previously, and the mirror current I1 flowing through the N-channel MOSFET 17 becomes 0.24 mA, which is approximately ⅕ of the mirror current obtained when the level of the gate voltage detection signal Vdg is low.

According to the second embodiment, the drive signal Vin configured by a pulse-width modulated (PWM) signal is kept at a high level when, for example, the drive signal Vin is not input from the external controller. As a result, the level of the output signal from the normal rotation output terminal B of the level shift circuit 20 becomes high, whereas the level of the output signal from the inverting output terminal BB becomes low.

Consequently, the P-channel MOSFET 14 is turned OFF, and the P-channel MOSFET 15 is turned ON. The P-channel MOSFET 16 is turned OFF as well. In the discharge circuit 4, on the other hand, the N-channel MOSFET 19 is turned ON.

Therefore, current injection (charging) into the gate of the IGBT 1 through the constant current source 3 is not carried out, and connecting the gate of the IGBT 1 to the ground line Lg through the N-channel MOSFET 19 of the discharge circuit 4 keeps the discharge state of the IGBT 1, keeping the OFF state of the IGBT 1.

When the level of the drive signal Vin becomes low in this OFF state of the IGBT 1, the level of the output signal from the normal rotation output terminal B of the level shift circuit 20 become low, whereas the level of the output signal from the inverting output terminal BB becomes high. As a result, the P-channel MOSFET 14 is turned ON, and the P-channel MOSFET 15 is turned OFF. Accordingly, a current mirror circuit is configured in the constant current source 3, wherein the mirror current I11 is supplied to the gate of the IGBT 1 through the P-channel MOSFET 16, starting current injection, or charging, on the IGBT 1.

At this moment, because the gate voltage Vg of the IGBT 1 is lower than the predetermined threshold voltage Vs, the level of the gate voltage detection signal Vdg that is output from the gate voltage detection circuit 7 is kept low. Therefore, the N-channel MOSFET 34 of the current mode selection circuit 6 is kept OFF, and the reference voltage Vref1 of a relatively high level (=3.46 V) is supplied to the non-inverting input terminal of the operational amplifier 23. As a result, the output signal of the operational amplifier 23 becomes a relatively high voltage. Consequently, the N-channel MOSFET 17 is turned ON, allowing the mirror current I1 of a relatively high level (=1.15 mA) to flow. Accordingly, the current kI1, which is k times the mirror current I1, is injected from the P-channel MOSFET 16 into the gate of the IGBT 1. As a result, the IGBT 1 is turned ON via the constant current source 3.

Here, when the gate voltage Vg rises and reaches the predetermined voltage Vs sufficiently higher than the threshold voltage of the IGBT 1 as a result of the injection of the current kI1 of the P-channel MOSFET 16 into the gate capacitance of the IGBT 1, the gate voltage detection signal Vdg of a high level is output from the gate voltage detection circuit 7. This gate voltage detection signal Vdg is supplied to the buffer 35 of the current mode selection circuit 6, turning the N-channel MOSFET 34 ON. As a result, the ground-side resistor 33 is bypassed, and the ground-side resistor 32 is connected directly to the ground line Lg.

In response thereto, the reference voltage decreases from Vref1 (=3.46 V) to Vref2 (=0.71 V), and the output voltage of the operational amplifier 23 decreases as well. Consequently, the mirror current I1 flowing through the N-channel MOSFET 17 is reduced to approximately ⅕, as described above. For this reason, the mirror current kI1, k times the mirror current I1, which is supplied to the IGBT 1 through the P-channel MOSFET 16, also drops. However, the gate capacitance of the IGBT 1 keeps its charged state and is therefore kept ON.

Because the rise time of the gate voltage is extremely shorter than the switching cycle of the drive signal Vin, a time period in which the gate voltage is less than the predetermined voltage Vs when the IGBT 1 is ON is extremely short. Therefore, the average value of the mirror current I1 becomes approximately equivalent to 0.24 mA obtained when the level of the gate voltage detection signal Vdg of the gate voltage detection circuit 7 is high. As a result, the mode of the constant current source can be set at the low power consumption mode.

Incidentally, in the case of the conventional example that is not provided with the gate voltage detection circuit 7 and the current mode selection circuit 6, the mirror current I1 in an amount of 1.15 mA continuously flows during the period in which the IGBT 1 is ON, causing the drive circuit to keep the state of high current consumption.

In the present embodiment, however, the consumption of current can be reduced by 1.15 mA−0.24 mA=0.91 mA during the period in which the IGBT 1 is ON. Because the period in which the IGBT 1 is ON becomes approximately half the calmative time of the drive signal Vin, the amount of current consumed can be reduced by approximately 0.91 mA/2=0.455 mA in the normal switching state.

However, when the level of the drive signal Vin becomes high, the level of the output signal that is output from the normal rotation output terminal B of the level shift circuit 20 becomes high, whereas the level of the output signal that is output from the inverting output terminal BB becomes low. As a result, the P-channel MOSFET 14 is turned OFF, and the P-channel MOSFET 15 is turned ON. Furthermore, the P-channel MOSFET 16 is turned OFF, stopping the injection of the current kI1 into the IGBT 1.

At the same time, because the drive signal Vin of a high level is input to the buffer 18 of the discharge circuit 4, the N-channel MOSFET 19 of this discharge circuit 4 is turned ON. As a result, the gate charge of the IGBT 1 is drawn to the ground line Lg through the P-channel MOSFET 19, whereby the IGBT 1 enters the discharge state, reducing the gate voltage and turning the IGBT 1 OFF.

According to the second embodiment described above, when turning the IGBT 1 ON and when the gate voltage Vg is less than the predetermined voltage Vs sufficiently higher than the threshold voltage for turning the IGBT 1 ON, the reference voltage Vref1 of a high level is supplied to the operational amplifier 23 by means of the current mode selection circuit 6, and the mirror current I1 of the constant current source 3 is set at the normal current value, to set the mode of the constant current source 3 at the normal current mode. Subsequently, when the gate voltage Vg reaches the predetermined voltage Vs, the reference voltage Vref2 of a low level is supplied to the operation amplifier 23 by means of the current mode selection circuit 6, and the mirror current I1 of the constant current source 3 is lowered to approximately ⅕ of the normal current value to set the mode of the constant current source 3 at the low current consumption mode. As a result, the amount of current consumed by the entire drive circuit can be reduced, while accelerating the time to turn the IGBT 1 ON.

In the first and second embodiments, the IGBT 1 is applied as an insulated gate switching element; however, the IGBT 1 is not limited thereto, and a different type of insulated gate switching element such as a MOSFET may be applied.

In the first and second embodiments, the current value obtained in the low consumption mode is lower than the current value obtained in the normal current mode by approximately ⅕; however, the amount of reduction is not limited thereto. Thus, when the gate voltage Vg of the insulated gate switching element is equal to or greater than the predetermined voltage Vs, the current value of the constant current source 3 may be reduce to a value that is 1/20 to 1/2 of the current value obtained in the normal current mode. When the current value obtained in the low current consumption mode of the constant current source 3 is less than 1/20 of the current value obtained in the normal current mode, the value of the current applied to the gate of the insulated gate switching element is too low to keep the insulated gate switching element ON. When the current value is less than 1/2 the current value obtained in the normal current mode, the effect of reducing the current consumption becomes low.

In the first and second embodiments, the MOSFETs are applied as active elements of the constant current source 3, the discharge circuit 4, the switching circuit 5, and the current mode selection circuit 6; however, the active elements are not limited to the MOSFETs. Any active elements such as FET and bipolar transistors can be applied.

Embodiments of the invention can provide a drive circuit for an insulated gate switching element, which is capable of accelerating the time to turn ON the insulated gate switching element, with a normal current mode of a constant current source, until a gate voltage of the insulated gate switching element reaches a predetermined voltage for turning the insulated gate switching element ON, and of minimizing the amount of current consumed by the drive circuit, with a low current consumption mode of the constant current source, once the gate voltage reaches the predetermined voltage for turning the insulated gate switching element ON.

Examples of specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the above description, specific details are set forth in order to provide a thorough understanding of embodiments of the invention. Embodiments of the invention may be practiced without some or all of these specific details. Further, portions of different embodiments and/or drawings can be combined, as would be understood by one of skill in the art.

What is claimed is:

1. A drive circuit for an insulated gate switching element, comprising:
   a constant current source that generates a constant current;
   a switching circuit that connects a gate of the insulated gate switching element to a power supply potential side via the constant current source when turning the insulated gate switching element ON and connects the gate of the insulated gate switching element to a reference potential side via a discharge circuit when turning the insulated gate switching element OFF, based on a drive signal;
   a gate voltage detection circuit that detects a gate voltage of the insulated gate switching element; and
   a current mode selection circuit that switches a mode of the constant current source from a normal current mode to a low current consumption mode when detecting, based on the gate voltage detected by the gate voltage detection circuit becoming equal to or greater than a predetermined value, that the insulated gate switching element is turned ON, and switches the mode of the constant current source from the low current consumption mode to the normal current mode when the gate voltage detected by the gate voltage detection circuit becomes less than the predetermined value;
   wherein the current mode selection circuit has a partial resistor having a power supply-side resistor and first and second ground-side resistors, connected between a positive power supply and a ground, and a switching element connected directly to, and in parallel with, the second ground-side resistor, sets a ground-side partial resistance value at a normal value when the gate voltage detected by the gate voltage detection circuit is less than the predetermined value, and sets the ground-side partial resistance value at a low consumption mode resistance value lower than the normal value when the gate voltage detected by the gate voltage detection circuit is equal to or greater than the predetermined value.

2. The drive circuit for an insulated gate switching element according to claim 1, wherein
   the constant current source has:
   a first transistor, a drain side of which is connected to a resistor;
   a second transistor that configures a current mirror along with the first transistor and generates a constant current defined by a terminal voltage and reference voltage of the resistor; and
   a third transistor that is current-mirror connected to the second transistor and has a drain connected to the gate of the insulated gate switching element.

3. The drive circuit for an insulated gate switching element according to claim 1, wherein
   the constant current source has:
   a first transistor, a drain side of which is connected to a resistor;
   a fourth transistor that is connected between the first transistor and the resistor and generates a constant current defined by a terminal voltage and reference voltage of the resistor; and
   a third transistor that configures a current mirror along with the first transistor and has a drain connected to the gate of the insulated gate switching element.

4. The drive circuit for an insulated gate switching element according to claim 1, wherein the current mode selection circuit sets the reference voltage at a normal voltage when the gate voltage detected by the gate voltage detection circuit is less than a predetermined value, and sets the reference voltage at a low consumption mode voltage lower than the normal voltage when the gate voltage detected by the gate voltage detection circuit is equal to or greater than the predetermined value.

5. The drive circuit for an insulated gate switching element according to claim 1, wherein a threshold value, based on which the gate voltage detection circuit outputs signals of different levels depending on the gate voltage of the insulated gate switching element, is set at 7 V to 14.5 V, wherein 7 V to 14.5V is the gate voltage of the insulated gate switching element.

6. The drive circuit for an insulated gate switching element according to claim 5, wherein the gate voltage detection circuit reduces a current value of the constant current source to an amount in the range of 1/20 to 1/2 of an amount before the current is reduced, when the gate voltage of the insulated gate switching element exceeds the threshold value.

7. The drive circuit for an insulted gate switching element according to claim 1, wherein the ground-side resistor of the current mode selection circuit includes two resistors.

* * * * *

UNITED STATES PATENT AND TRADEMARK OFFICE
CERTIFICATE OF CORRECTION

PATENT NO.           : 9,246,474 B2                                   Page 1 of 1
APPLICATION NO.      : 13/738100
DATED                : January 26, 2016
INVENTOR(S)          : Kazumi Takagiwa It is certified that error appears in the above-identified patent and that said Letters Patent is hereby corrected as shown below:

In the Claims,

Claim 4, line 42, "circuit sets the reference" should read as follows --circuit sets a reference--.

Signed and Sealed this
Third Day of May, 2016

Michelle K. Lee
*Director of the United States Patent and Trademark Office*